(12) United States Patent
Makiyama

(10) Patent No.: US 9,548,383 B2
(45) Date of Patent: Jan. 17, 2017

(54) HEMT WITH A METAL FILM BETWEEN THE GATE ELECTRODE AND THE DRAIN ELECTRODE

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/337,911

(22) Filed: Jul. 22, 2014

(65) Prior Publication Data
US 2015/0060946 A1    Mar. 5, 2015

(30) Foreign Application Priority Data

Aug. 27, 2013 (JP) .................................. 2013-176002

(51) Int. Cl.
| | |
|---|---|
| *H01L 29/778* | (2006.01) |
| *H01L 29/10* | (2006.01) |
| *H01L 29/66* | (2006.01) |
| *H01L 29/40* | (2006.01) |
| *H01L 23/31* | (2006.01) |

(Continued)

(52) U.S. Cl.
CPC ......... *H01L 29/7786* (2013.01); *H01L 23/315* (2013.01); *H01L 29/1058* (2013.01); *H01L 29/402* (2013.01); *H01L 29/66431* (2013.01); *H01L 29/66462* (2013.01); *H01L 29/7787* (2013.01); *H01L 29/41758* (2013.01); *H01L 29/42316* (2013.01); *H01L 29/42376* (2013.01); *H01L 2224/05553* (2013.01); *H01L 2224/05554* (2013.01); *H01L 2224/0603* (2013.01); *H01L 2224/48091* (2013.01); *H01L 2224/48247* (2013.01); *H01L 2224/48257* (2013.01); *H01L 2224/48472* (2013.01)

(58) Field of Classification Search
CPC ............ H01L 29/7786; H01L 29/1058; H01L 29/66431; H01L 29/402
USPC .......................................................... 257/194
See application file for complete search history.

(56) References Cited

U.S. PATENT DOCUMENTS

| | | | |
|---|---|---|---|
| 2002/0024057 A1* | 2/2002 | Inokuchi | ........... H01L 29/42316 257/155 |
| 2006/0202272 A1 | 9/2006 | Wu et al. | |
| 2009/0078966 A1* | 3/2009 | Asai et al. | ..................... 257/194 |

(Continued)

FOREIGN PATENT DOCUMENTS

| | | |
|---|---|---|
| JP | 2008-533717 | 8/2008 |
| JP | 2009-032724 | 2/2009 |

(Continued)

OTHER PUBLICATIONS

JPOA—Japanese Office Action mailed Oct. 18, 2016 for Japanese Patent Application No. 2013-176002, with partial English translation.

*Primary Examiner* — Peter Bradford
(74) *Attorney, Agent, or Firm* — Fujitsu Patent Center

(57) ABSTRACT

A compound semiconductor device includes a channel layer of first arsenide semiconductor, an electron supply layer of second arsenide semiconductor over the channel layer, a gate electrode, a source electrode and a drain electrode over the channel layer, and a metal film between the gate electrode and the drain electrode, the metal film being insulated from the gate electrode and the drain electrode.

10 Claims, 14 Drawing Sheets

(51) Int. Cl.
  *H01L 29/417* (2006.01)
  *H01L 29/423* (2006.01)

(56) References Cited

U.S. PATENT DOCUMENTS

| | | | |
|---|---|---|---|
| 2009/0104881 A1* | 4/2009 | Ogawa | H01L 27/0605 455/83 |
| 2011/0235363 A1* | 9/2011 | An | H01L 25/0753 362/606 |
| 2013/0069115 A1 | 3/2013 | Nakazawa et al. | |
| 2013/0082305 A1* | 4/2013 | Yuan | H01L 29/42316 257/194 |

FOREIGN PATENT DOCUMENTS

| | | | |
|---|---|---|---|
| JP | 2011-249439 | | 12/2011 |
| WO | 2006/098801 | | 9/2006 |
| WO | WO 2011/148443 | * | 1/2011 |

* cited by examiner

HEMT WITH A METAL FILM BETWEEN THE GATE ELECTRODE AND THE DRAIN ELECTRODE

CROSS-REFERENCE TO RELATED APPLICATION

This application is based upon and claims the benefit of priority of the prior Japanese Patent Application No. 2013-176002, filed on Aug. 27, 2013, the entire contents of which are incorporated herein by reference.

FIELD

The embodiments discussed herein are directed to a compound semiconductor device and a method of manufacturing the same, and so on.

BACKGROUND

In a compound semiconductor device, particularly in a super-high frequency device such as a high electron mobility transistor (HEMT) including an arsenide semiconductor layer over a substrate such as an InP substrate, higher frequency has been trying to be enabled by reducing a gate intrinsic capacitance or a gate parasitic capacitance. As a way to reduce a gate intrinsic capacitance, shortening of a gate length is cited. As a way to reduce a gate parasitic capacitance, it is cited to form a cavity at an interlayer insulating film at a periphery of a gate, and to use an air bridge wiring structure without forming an interlayer insulating film at a periphery of a gate.

However, it is difficult to further improve output characteristics such as a gain by these conventional HEMTs.

[Patent Document 1] Japanese Laid-open Patent Publication No. 2011-249439

[Patent Document 2] Japanese National Publication of International Patent Application No. 2008-533717

SUMMARY

According to an aspect of embodiments, a compound semiconductor device includes a channel layer of first arsenide semiconductor, an electron supply layer of second arsenide semiconductor over the channel layer, a gate electrode, a source electrode and a drain electrode over the channel layer, and a metal film between the gate electrode and the drain electrode, the metal film being insulated from the gate electrode and the drain electrode.

According to another aspect of embodiments, in a method of manufacturing a compound semiconductor device, a channel layer of first arsenide semiconductor is formed, an electron supply layer of second arsenide semiconductor is formed over the channel layer, a gate electrode, a source electrode and a drain electrode are formed over the channel layer, and a metal film is formed between the gate electrode and the drain electrode, the metal film being insulated from the gate electrode and the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The present inventor studied about causes why good output characteristics cannot be obtained in a conventional HEMT including an arsenide semiconductor layer. As a result, it turns out that it is conventionally regarded as important to reduce a parasitic capacitance $C_{gs}$ between a gate and a source to improve a current gain cut-off frequency $f_T$, and that a maximum oscillation frequency $f_{max}$ improves by reducing a parasitic capacitance $C_{gd}$ between a gate and a drain. Besides, it also turns out that in a conventional HEMT including an arsenide semiconductor layer, a cavity structure, an air bridge structure, or the like is used to enable a high frequency operation, and therefore, it is difficult to use a field plate, which is effective to reduce a parasitic capacitance $C_{gd}$ between a gate and a drain. Note that a field plate is mainly used in a GaN-based HEMT, an operation voltage thereof is high, and therefore, a region where the field plate is formed is normally limited to a region right above a gate electrode. On the other hand, the present inventor found out that, even if a component such as a field plate is provided at a position where it is particularly easy to contribute to reduce a parasitic capacitance $C_{gd}$, problems which occur in a GaN-based HEMT, for example, a short circuit between a source and a drain do not occur, since operation voltage of a HEMT including an arsenide semiconductor layer is low. Further, the present inventor also found out that in a structure in which a component such as a field plate is provided, a parasitic capacitance $C_{gs}$ increases due to decrease of a parasitic capacitance $C_{gd}$, but lowering of a current gain cut-off frequency $f_r$ in accordance with the increase of the parasitic capacitance $C_{gs}$ is restrictive. This is because in many cases, the parasitic capacitance $C_{gs}$ is approximately 10 times as much as the parasitic capacitance $C_{gd}$, and therefore, a ratio of change of the parasitic capacitance $C_{gs}$ is extremely small. Accordingly, it is possible to improve a maximum oscillation frequency $f_{max}$ while suppressing lowering of a current gain cut-off frequency $f_r$ by reducing a parasitic capacitance $C_{gd}$. Then, output characteristics such as gain are improved by the improvement of the maximum oscillation frequency $f_{max}$. The present inventor came to various embodiments described below based on the above-stated knowledge.

Hereinafter, preferred embodiments of the present invention will be explained concretely with reference to accompanying drawings.

First Embodiment

Figure 1A:
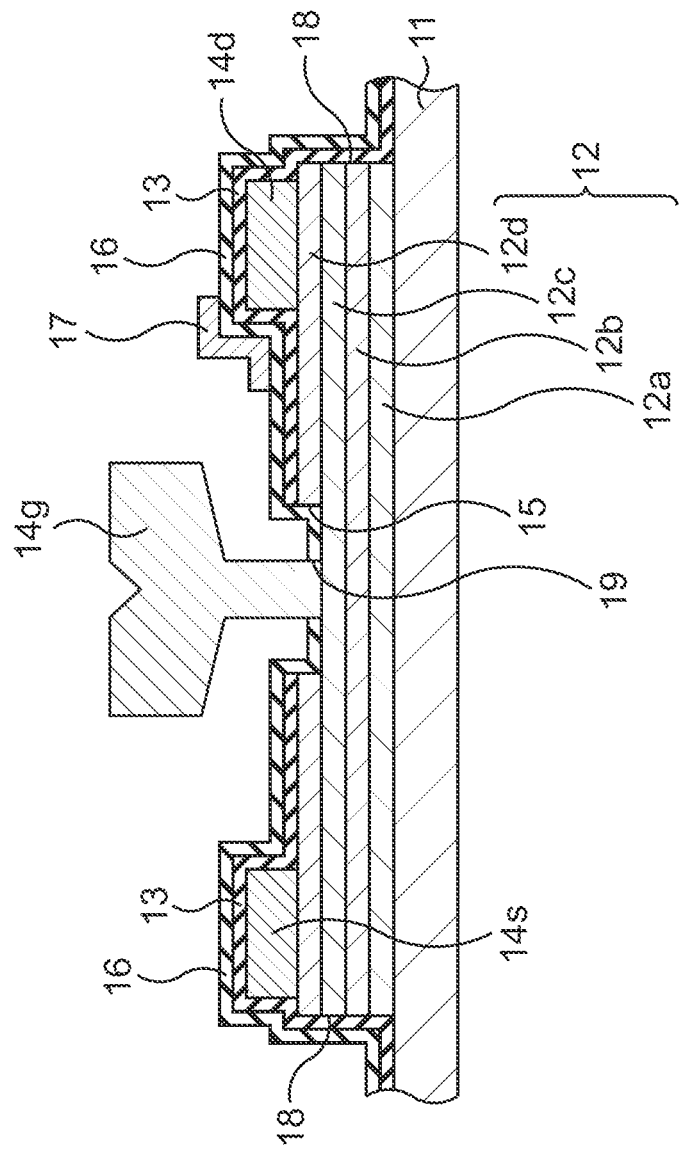
FIG. 1A is a sectional view illustrating a structure of a compound semiconductor device according to a first embodiment.

First, a first embodiment is described. FIG. 1A is a sectional view illustrating a structure of a compound semiconductor device (HEMT) according to the first embodiment.

In the first embodiment, as illustrated in FIG. 1A, a buffer layer 12a, a channel layer 12b, an electron supply layer 12c and a surface layer 12d are formed on a substrate 11 such as a semi-insulating InP substrate, for example. The buffer layer 12a, the channel layer 12b, the electron supply layer 12c and the surface layer 12d are included in a semiconductor stacked structure 12 of arsenide compound. The buffer layer 12a and the channel layer 12b each are an InGaAs layer (i-InGaAs layer) to which intentional impurity doping is not performed, for example. The buffer layer 12a prevents propagation of lattice defects existing at a surface of the substrate 11 to the channel layer 12b, for example. The electron supply layer 12c is an n-type InAlAs layer (n-InAlAs layer), for example. The surface layer 12d is an n-type InGaAs layer (n-InGaAs layer), for example. Two-dimensional electron gas (2DEG) exists in a vicinity of an interface of the channel layer 12b with the electron supply layer 12c.

An element isolation region 18 defining an active region is formed in the buffer layer 12a, the channel layer 12b, the electron supply layer 12c and the surface layer 12d. A source electrode 14s and a drain electrode 14d are formed on the surface layer 12d in the active region. An insulating film 13 covering the source electrode 14s and the drain electrode 14d is also formed on the surface layer 12d. The insulating film 13 is a silicon nitride film, for example. A recess 15 through which the electron supply layer 12c is exposed is formed in the surface layer 12d and the insulating film 13 between the source electrode 14s and the drain electrode 14d. An insulating film 16 is formed on the insulating film 13. The insulating film 16 covers the electron supply layer 12c inside the recess 15, and a recess 19 through which the electron supply layer 12c is exposed is formed in the insulating film 16 inside the recess 15. The insulating film 16 is a silicon nitride film, for example. A gate electrode 14g which is in contact with the electron supply layer 12c via the recess 19 is formed. A cross-sectional shape of the gate electrode 14g is approximately T-shaped, for example. An electric flux line collecting part 17 is formed on the insulating film 16 between the gate electrode 14g and the drain electrode 14d. The electric flux line collecting part 17 includes a part at a level below a vertex part of the gate electrode 14g. The electric flux line collecting part 17 includes a metal film, for example. In the first embodiment, an object on the insulating film 16 is only the electric flux line collecting part 17, and there is a space on the insulating film 16 except a part where the electric flux line collecting part 17 is formed.

In the HEMT constituted as stated above, a part of the electric flux line heading from the gate electrode 14g to the drain electrode 14d is collected by the electric flux line collecting part 17. Accordingly, it is possible to reduce the parasitic capacitance $C_{gd}$ between the gate electrode 14g and the drain electrode 14d compared to a structure in which the electric flux line collecting part 17 is not provided. Accordingly, it is possible to improve the maximum oscillation frequency $f_{max}$, which is important to improve the gain of the HEMT.

An electric potential of the electric flux line collecting part 17 is not particularly limited, but the electric flux line collecting part 17 is preferably connected to the source electrode 14s. When the electric flux line collecting part 17 is connected to the source electrode 14s, the part of electric flux line collected by the electric flux line collecting part 17 act similarly to the electric flux line heading from the gate electrode 14g to the source electrode 14s, and a parasitic capacitance $C_{gs}$ between the gate electrode 14g and the source electrode 14s increases. On the other hand, the parasitic capacitance $C_{gd}$ between the gate electrode 14g and the drain electrode 14d decreases. Accordingly, it is possible to more certainly improve the maximum oscillation frequency $f_{max}$, which is important to improve gain of a HEMT. Even if the parasitic capacitance $C_{gs}$ between the gate electrode 14g and the source electrode 14s increases, the effect thereof is small, and therefore, lowering of a current gain cut-off frequency $f_r$ according to the increase of the parasitic capacitance $C_{gs}$ is restrictive. Namely, even if a part of the parasitic capacitance $C_{gd}$ is distributed to the parasitic capacitance $C_{gs}$, the effect thereof is restrictive. The electric flux line collecting part 17 and the source electrode 14s may be connected via a wiring routed not right above but at a side of the gate electrode 14g, for example, or the like. It is possible to obtain a similar effect even when the electric flux line collecting part 17 is not connected to the source electrode 14s, if it is grounded, for example.

As stated above, according to the first embodiment, it is possible to adjust the parasitic capacitance $C_{gs}$ and the parasitic capacitance $C_{gd}$ properly, and to improve the output characteristics. In particular, it is extremely suitable for a super-high frequency device whose drain conductance is high and drain voltage (operation voltage) is small such as approximately 1 V.

Figure 1B:
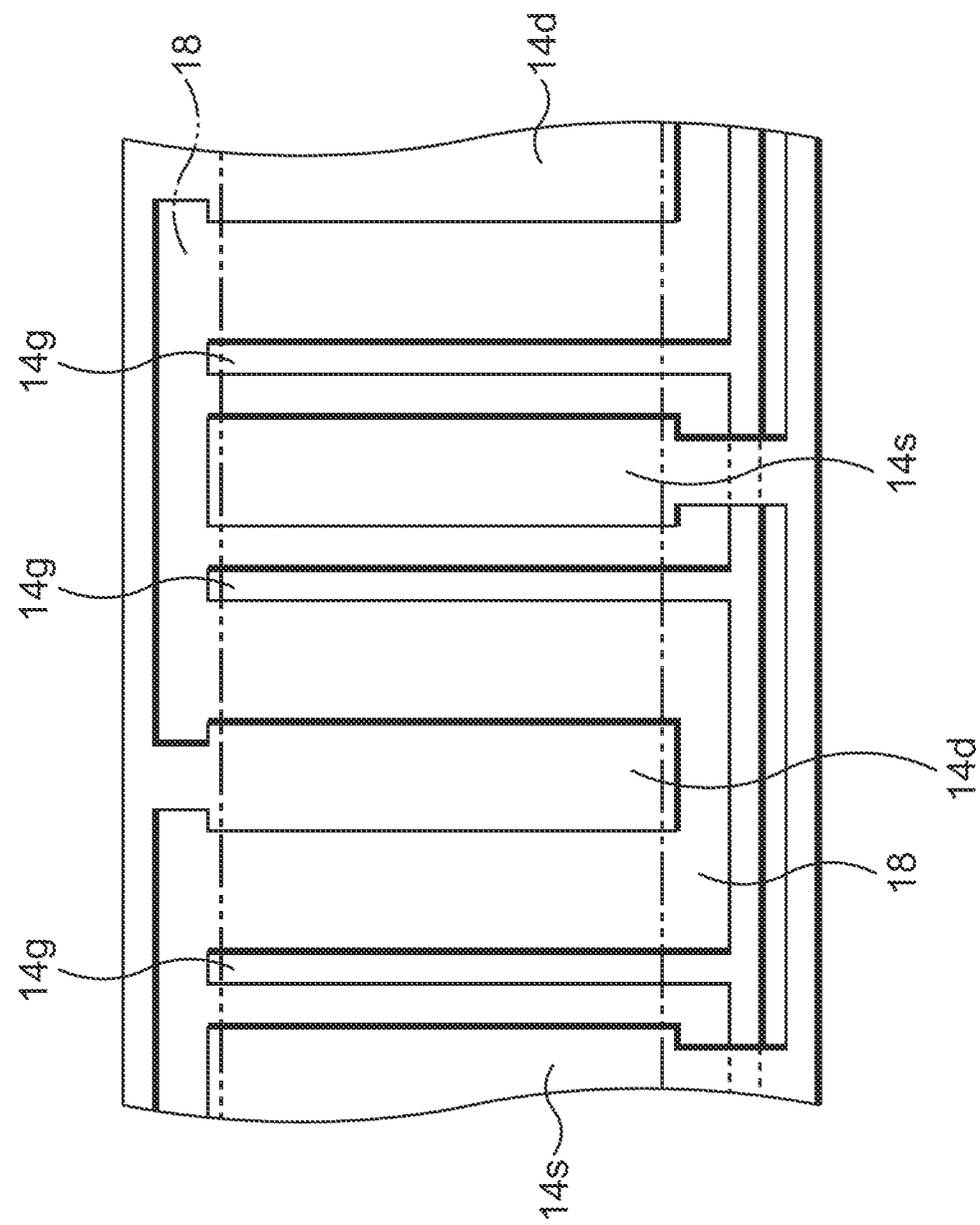
FIG. 1B is a view illustrating a layout of the compound semiconductor device according to the first embodiment.

FIG. 1B illustrates an example of a layout seen from a front surface side of the substrate 11. Namely, a planar shape of the gate electrodes 14g, the source electrodes 14s and the drain electrodes 14d is a comb-teeth shape, and the source electrodes 14s and the drain electrodes 14d are alternately disposed. The plural gate electrodes 14g are commonly connected with each other, the plural source electrodes 14s are commonly connected with each other, and the plural drain electrodes 14d are commonly connected with each other. A multi-finger gate structure as stated above is applied, and thereby, it is possible to further improve output power.

Figure 2A:
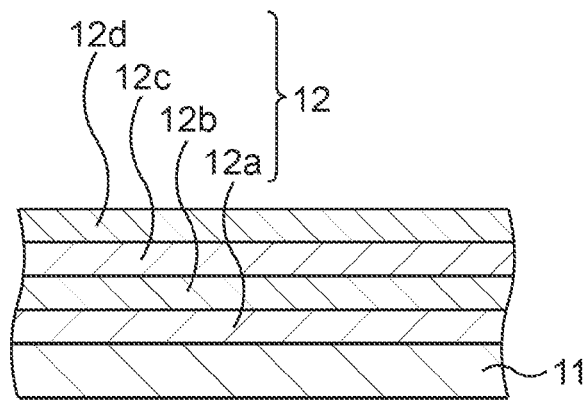
FIG. 2A to FIG. 2O are sectional views illustrating a method of manufacturing the compound semiconductor device according to the first embodiment in process sequence.

Next, a method of manufacturing the compound semiconductor device (HEMT) according to the first embodiment is described. FIG. 2A to FIG. 2O are sectional views illustrating the method of manufacturing the compound semiconductor device according to the first embodiment in process sequence.

First, as illustrated in FIG. 2A, the buffer layer 12a, the channel layer 12b, the electron supply layer 12c and the surface layer 12d are epitaxially grown on the substrate 11 such as a semi-insulating InP substrate by a metal organic chemical vapor deposition (MOCVD) method, for example. The buffer layer 12a, the channel layer 12b, the electron supply layer 12c and the surface layer 12d are included in the compound semiconductor stacked structure 12.

Figure 2B:
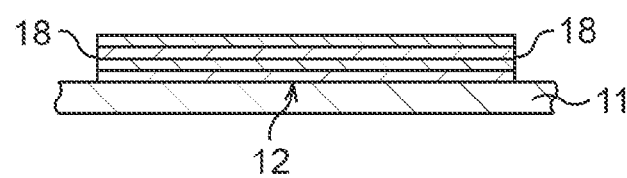

Then, as illustrated in FIG. 2B, selective wet-etching of the compound semiconductor stacked structure 12 is performed to thereby form the element isolation regions 18 defining the active region in the compound semiconductor stacked structure 12. The formation of the element isolation regions 18 may be performed by selective injection of oxygen.

Figure 2C:
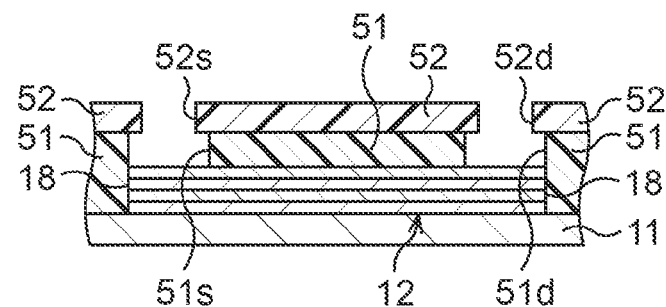

Thereafter, as illustrated in FIG. 2C, a resist pattern 51 and a resist pattern 52 are formed on the compound semiconductor stacked structure 12. The resist pattern 51 has an opening 51s at a region where the source electrode is to be formed, and has an opening 51d at a region where the drain electrode is to be formed. The resist pattern 52 has an opening 52s at a region where the source electrode is to be formed, and has an opening 52d at a region where the drain electrode is to be formed. In the formation of the resist pattern 51 and the resist pattern 52, two resist layers are formed, and the opening 52s and the opening 52d are formed in the upper resist layer to form the resist pattern 52. Then, the opening 51s and the opening 51d are formed in the lower resist layer with using the resist pattern 52 as a mask to thereby form the resist pattern 51 having a set-back structure. Polymethylglutarimide (PMGI) (for example, manufactured by MicroChem Corp., USA) is used as a material of the resist pattern 51, for example, and ZEP520 manufactured by ZEON Corporation, Japan is used as a material of the resist pattern 52, for example. The resist materials may be coated by a spin coating method, and pre-baked at 180° C. for five minutes in an $N_2$ gas atmosphere. Electron beam lithography is performed in exposure, and a mixed developing solution of methylethylketone (MEK) and methylisobutylketone (MIBK) is used as a developing solution, for example, when the opening 52s and the opening 52d are formed. In the formation of the opening 51s and the opening 51d, NMD-W manufactured by TOKYO OHKA KOGYO Co., Ltd. is used as a developing solution, for example. A stacked resist pattern in an eaves structure is thereby obtained.

Figure 2D:
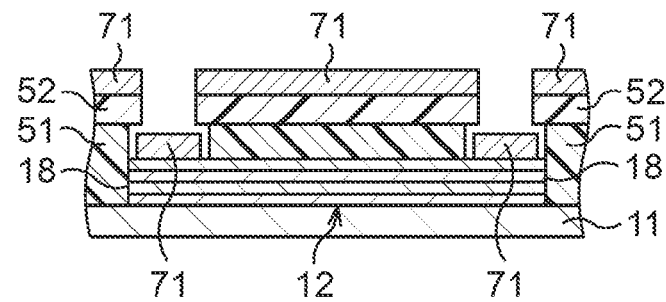

Subsequently, as illustrated in FIG. 2D, a metal film 71 is formed by a vacuum deposition method. In the formation of the metal film 71, a Ti layer is formed, and a Au layer is formed thereon. A thickness of the Ti layer is approximately 20 nm, and a thickness of the Au layer is approximately 300 nm.

Figure 2E:
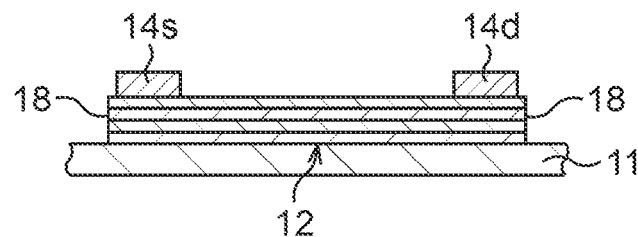

Then, as illustrated in FIG. 2E, the resist pattern 52 and the resist pattern 51 are removed together with the metal film 71 thereon with a heated organic solvent, for example. Namely, a part of the metal film 71 is remained on the surface layer 12d by a lift-off method. As a result, the source electrode 14s and the drain electrode 14d are obtained.

Figure 2F:
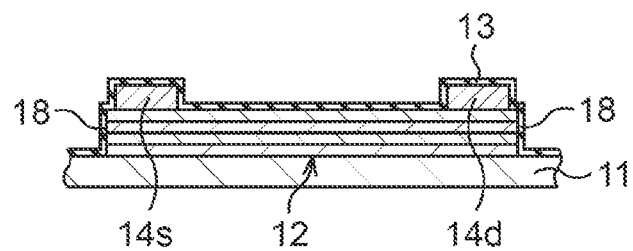

Thereafter, as illustrated in FIG. 2F, the insulating film 13 covering the surface layer 12d, the source electrode 14s and the drain electrode 14d is formed. A silicon nitride film is formed as the insulating film 13 by a plasma CVD method, for example. A thickness of the insulating film 13 is approximately 20 nm, for example.

Figure 2G:
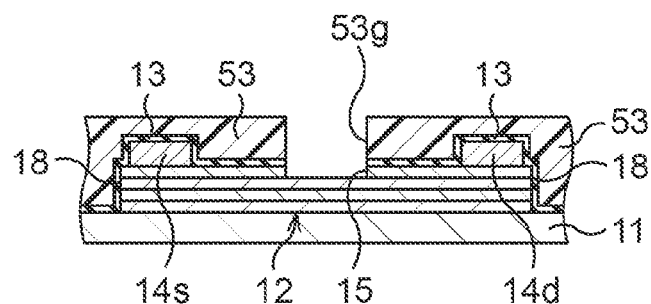

Subsequently, as illustrated in FIG. 2G, a resist pattern 53 having an opening 53g at a region where the recess 15 for gate is to be formed is formed on the insulating film 13. Polymethyl methacrylate (PMMA) (for example, manufactured by MicroChem Corp., USA) is used as a material of the resist pattern 53, for example. Electron beam lithography is performed in exposure, and a mixed developing solution of MIBK and isopropyl alcohol (IPA) (for example, manufactured by ZEON Corporation, Japan) is used as a developing solution, for example, when the opening 53g is formed. After the resist pattern 53 is formed, dry-etching using the resist pattern 53 as a mask is performed to thereby form the recess 15 in the insulating film 13. In this dry-etching, $SF_6$ gas is used, for example. A size of the recess 15 along the direction from the source electrode 14s to the drain electrode 14d is approximately 200 nm. Further, wet-etching is performed to form the recess 15 also in the surface layer 12d.

Figure 2H:
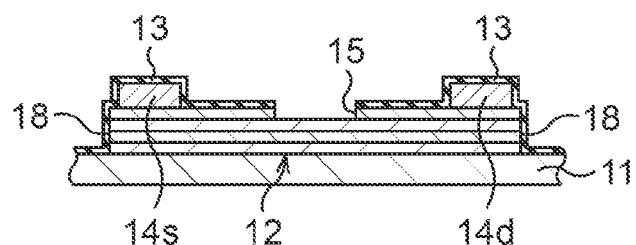
Figure 2I:
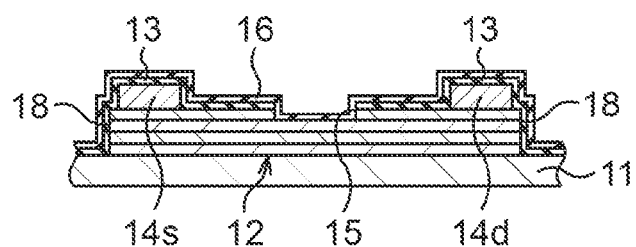

Thereafter, as illustrated in FIG. 2H, the resist pattern 53 is removed, and as illustrated in FIG. 2I, the insulating film 16 is formed on the insulating film 13. The insulating film 16 is formed also inside the recess 15. A silicon nitride film is formed as the insulating film 16 by a plasma CVD method, for example.

Figure 2J:
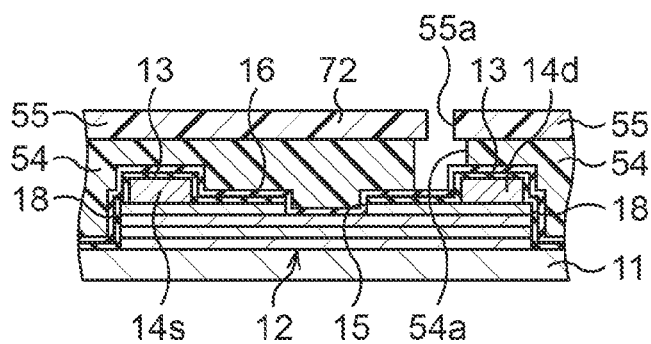

Subsequently, as illustrated in FIG. 2J, a resist pattern 54 and a resist pattern 55 are formed on the insulating film 16. The resist pattern 54 has an opening 54a at a region where the electric flux line collecting part 17 is to be formed. The resist pattern 55 has an opening 55a at a region where the electric flux line collecting part 17 is to be formed. In the formation of the resist pattern 54 and the resist pattern 55, two resist layers are formed, and the opening 55a is formed in the upper resist layer to thereby form the resist pattern 55. Then, the opening 54a is formed in the lower resist layer with using the resist pattern 55 as a mask to thereby form the resist pattern 54 having a set-back structure. PMGI (for example, manufactured by MicroChem Corp., USA) is used as a material of the resist pattern 54, for example, and ZEP520 manufactured by ZEON Corporation, Japan) is used as a material of the resist pattern 55, for example. For example, a thickness of the resist pattern 54 is approximately 500 nm, and a thickness of the resist pattern 55 is approximately 300 nm. The resist materials may be coated by a spin coating method, and pre-baked at 180° C. for five minutes in an $N_2$ gas atmosphere. Electron beam lithography is performed in exposure, and a mixed developing solution of MEK and MIBK is used as a developing solution, for example, when the opening 55a is formed. A size of the opening 55a along the direction from the source electrode 14s to the drain electrode 14d is approximately 0.5 µm, for example. In the formation of the opening 54a, NMD-W manufactured by TOKYO OHKA KOGYO Co., Ltd. is used as a developing solution, for example. A size of the opening 54a along the direction from the source electrode 14s to the drain electrode 14d is approximately 1.5 µm, for example. A stacked resist pattern in an eaves structure is thereby obtained.

Figure 2K:
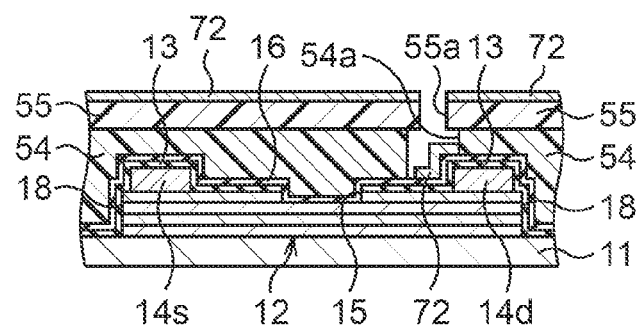

Then, as illustrated in FIG. 2K, a metal film 72 is formed by a vacuum deposition method. In the formation of the metal film 72, a Ti layer is formed, and a Au layer is formed thereon. A thickness of the Ti layer is approximately 20 nm, and a thickness of the Au layer is approximately 100 nm.

Figure 2L:
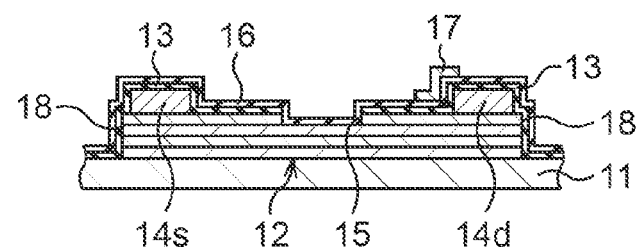

Thereafter, as illustrated in FIG. 2L, the resist pattern 54 and the resist pattern 55 are removed together with the metal film 72 thereon with a heated organic solvent, for example. As a result, the electric flux line collecting part 17 is obtained.

Figure 2M:
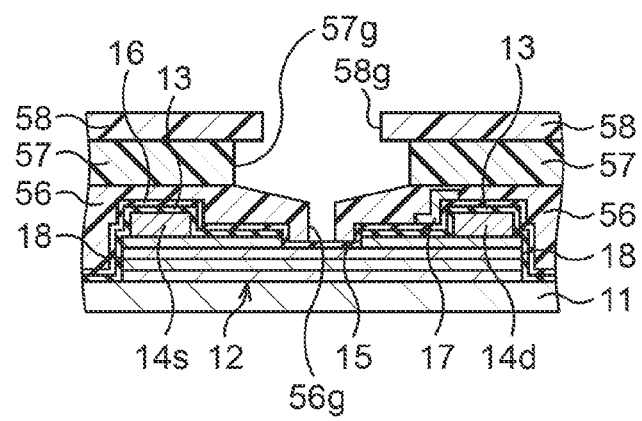

Subsequently, as illustrated in FIG. 2M, a resist pattern 56, a resist pattern 57 and a resist pattern 58 are formed on the insulting film 16. The resist pattern 56 has an opening 56g at a region where the gate electrode 14g is to be formed. The resist pattern 57 has an opening 57g at a region where the gate electrode 14g is to be formed. The resist pattern 58 has an opening 58g at a region where the gate electrode 14g is to be formed. In the formation of the resist pattern 56, the resist pattern 57, and the resist pattern 58, three resist layers are formed, and the opening 58g is formed in the upper-most resist layer to form the resist pattern 58. Then, the opening 57g is formed in the intermediate resist layer with using the resist pattern 58 as a mask to thereby form the resist pattern 57 having a set-back structure. A resist patter for lift-off is formed. And thereafter, the opening 56g is formed in the lower-most resist layer to form the resist pattern 56. PMMA (for example, manufactured by MicroChem Corp., USA) is used as a material of the resist pattern 56, for example. PMGI (for example, manufactured by MicroChem Corp., USA) is used as a material of the resist pattern 57, for example. ZEP520 manufactured by ZEON Corporation, Japan) is used as a material of the resist pattern 58, for example. For example, a thickness of the resist pattern 56 is approximately 300 nm, a thickness of the resist pattern 57 is approximately 500 nm, and a thickness of the resist pattern 58 is approximately 300 nm. The electron beam resist materials may be coated by a spin coating method, and pre-baked at 180° C. for five minutes in an $N_2$ gas atmosphere. Electron beam lithography is performed in exposure, and a mixed developing solution of MEK and MIBK is used as a developing solution, for example, when the opening 58g is formed. A size of the opening 58g along the direction from the source electrode 14s to the drain electrode 14d is approximately 0.7 μm, for example. In the formation of the opening 57g, NMD-W manufactured by TOKYO OHKA KOGYO Co., Ltd. is used as a developing solution, for example. A size of the opening 57g along the direction from the source electrode 14s to the drain electrode 14d is approximately 1.7 μm, for example. A stacked resist pattern in an eaves structure is thereby obtained. Electron beam lithography is performed in exposure, and a mixed developing solution of MIBK and IPA is used as a developing solution, for example, when the opening 56g is formed. A size of the opening 56g along the direction from the source electrode 14s to the drain electrode 14d is approximately 0.1 μm, for example.

Figure 2N:
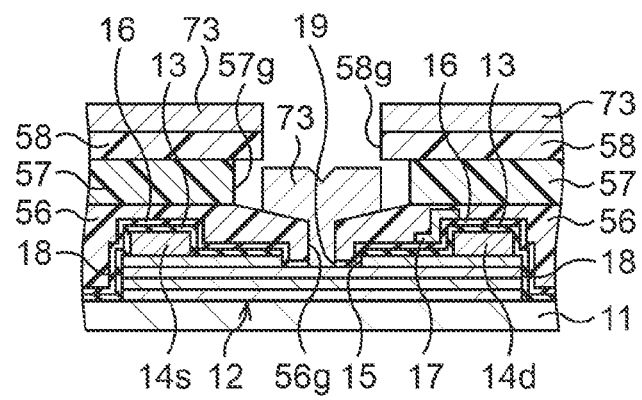
Figure 2O:
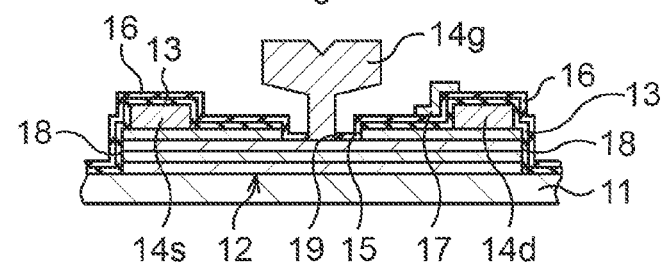

Then, as illustrated in FIG. 2N, dry-etching using the resist pattern 58, the resist pattern 57, and the resist pattern 56 as a mask is performed, and thereby, the recess 19 is formed in the insulating film 16. In this dry-etching, $SF_6$ gas is used, for example. A size of the recess 19 along the direction from the source electrode 14s to the drain electrode 14d is approximately 0.1 μm. Thereafter, a metal film 73 is formed by a vacuum deposition method. In the formation of the metal film 73, a Ti layer is formed, and a Au layer is formed thereon. A thickness of the Ti layer is approximately 20 nm, and a thickness of the Au layer is approximately 300 nm.

Subsequently, as illustrated in FIG. 2O, the resist pattern 58, the resist pattern 57 and the resist pattern 56 are removed together with the metal film 73 thereon with a heated organic solvent, for example. Namely, a part of the metal film 73 is remained on the electron supply layer 12c by a lift-off method. As a result, the gate electrode 14g is obtained.

A protective film, a wiring and so on are formed according to need, to complete the compound semiconductor device (HEMT). When the wiring is formed, it is preferable to employ an air bridge structure. When the air bridge structure is employed, for example, the wiring is formed with a photoresist or low dielectric constant filler, and then the filler is removed.

Figure 9:
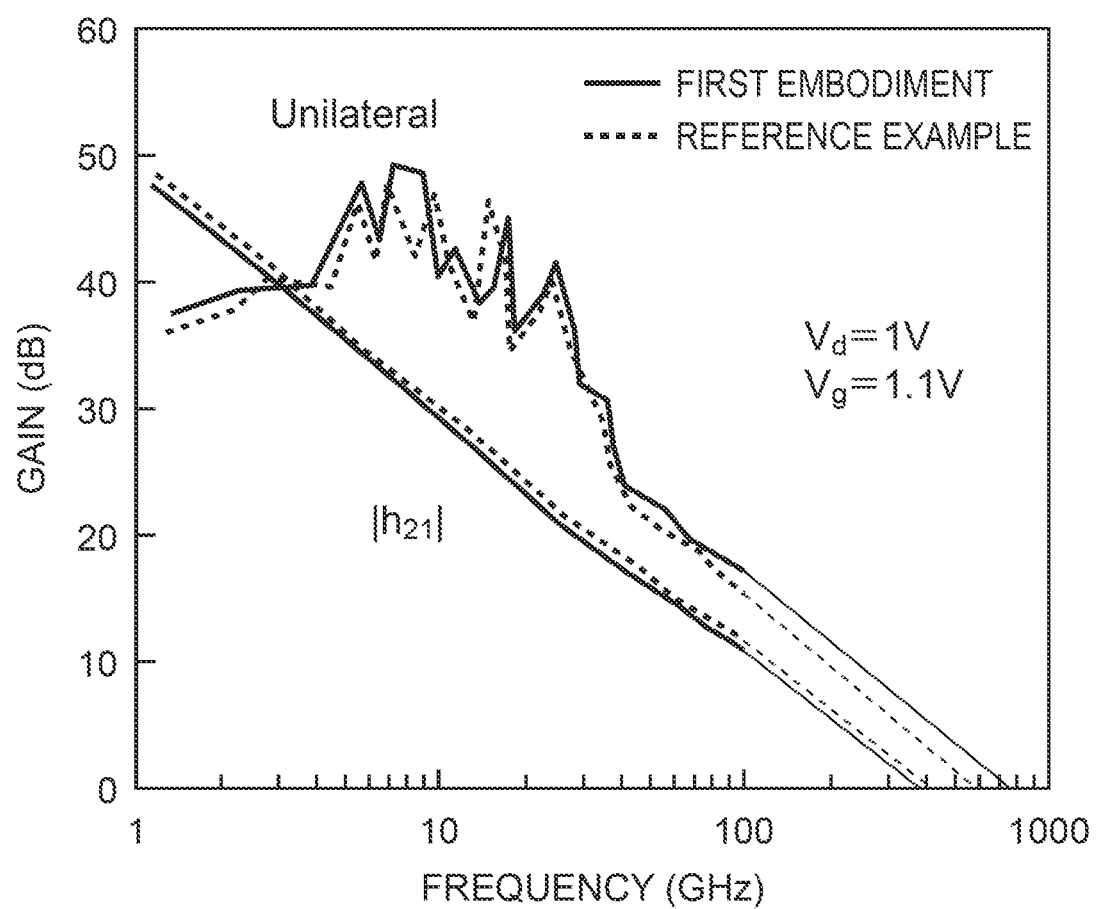
FIG. 9 is a view illustrating a frequency dependence of a power gain.

Small signal parameters of a compound semiconductor device manufactured by the present inventor following the first embodiment are listed in Table 1. In Table 1, small signal parameters of a reference example in which the electric flux line collecting part 17 is not provided are also listed. A frequency dependence of a power gain is illustrated in FIG. 9. The electric flux line collecting part in the first embodiment is used, and thereby, an improvement effect of a unilateral power gain is obtained. The gate capacitance, the current gain cut-off frequency $f_r$, the maximum oscillation frequency $f_{max}$ are listed in the table 1. Though the $f_r$ is lowered according to the electric flux line collecting part, a large improvement effect is obtained in the $f_{max}$.

TABLE 1

|  | First embodiment | Reference example |
|---|---|---|
| $C_{gs}$ (fF/mm) | 400 | 350 |
| $C_{gd}$ (fF/mm) | 50 | 100 |
| $C_{ds}$ (fF/mm) | 250 | 150 |
| $f_T$ (GHz) | 380 | 390 |
| $f_{max}$ (GHz) | 750 | 540 |

Second Embodiment

Figure 3:
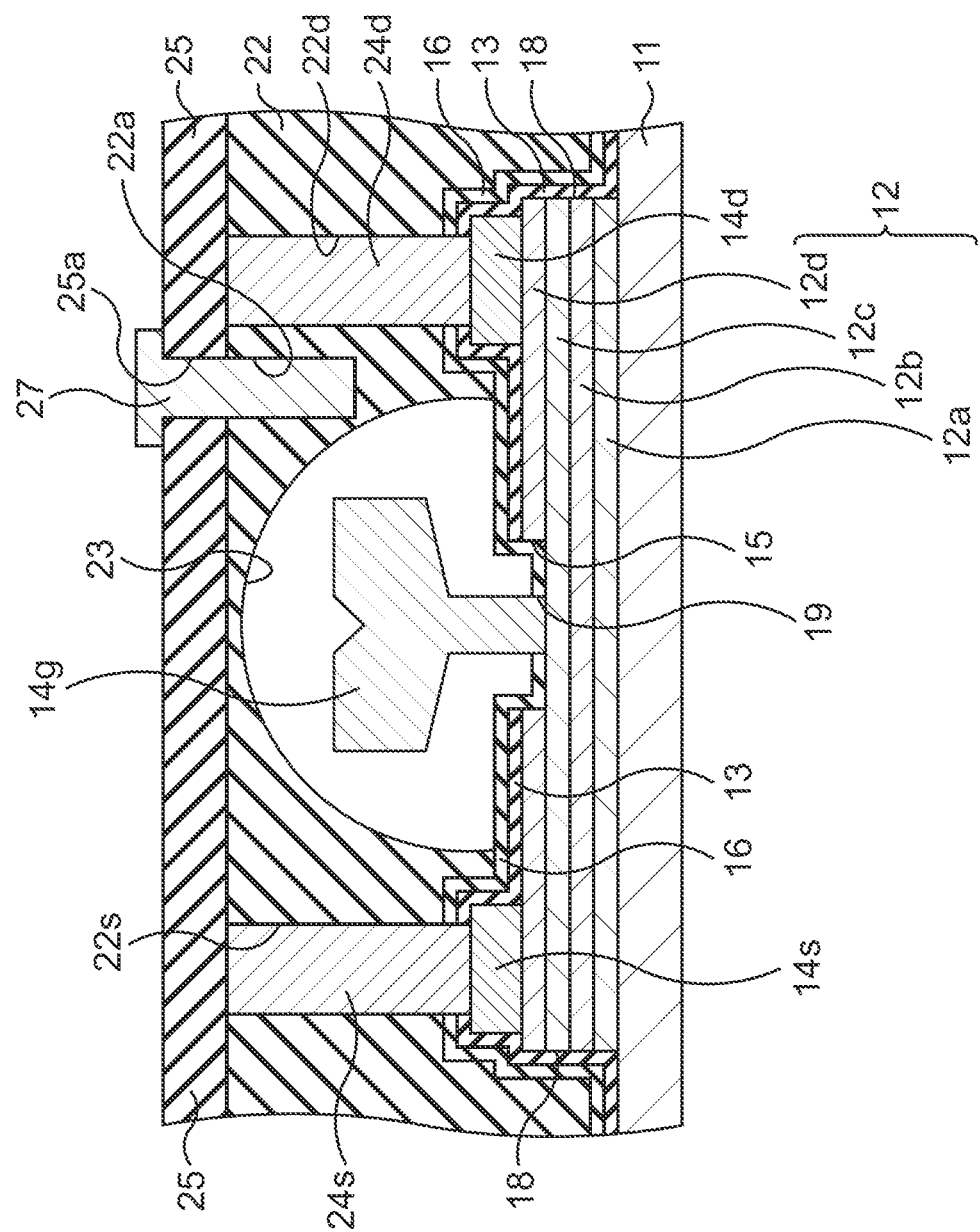
FIG. 3 is a sectional view illustrating a structure of a compound semiconductor device according to a second embodiment.

Next, a second embodiment is described. FIG. 3 is a sectional view illustrating a structure of a compound semiconductor device (HEMT) according to the second embodiment.

In the second embodiment, as illustrated in FIG. 3, an interlayer insulating film 22 is formed on the insulating film 16. A cavity part 23 is formed in the interlayer insulating film 22, and the gate electrode 14g is inside the cavity part 23. An opening 22s reaching the source electrode 14s and an opening 22d reaching the drain electrode 14d are formed in the interlayer insulating film 22, the insulating film 16 and the insulating film 13, a conductive film 24s is formed in the opening 22s, and a conductive film 24d is formed in the opening 22d. An insulating film 25 is formed on the interlayer insulating film 22, and an opening 25a is formed in the insulating film 25, and an opening 22a being connected to the opening 25a is formed in the interlayer insulating film 22. The opening 25a and the opening 22a are between the gate electrode 14g and the drain electrode 14d in planar view, and a lower end of the opening 22a is beyond a level of a vertex part of the gate electrode 14g to the substrate 11 side. An electric flux line collecting part 27 is formed to include a part in the opening 22a and the opening 25a. The electric flux line collecting part 27 includes a part at a level below the vertex part of the gate electrode 14g. The interlayer insulating film 22 is a benzocyclobutene (BCB) film, for example. The insulating film 25 is a silicon nitride film, for example. The other structures are the same as the first embodiment.

In the HEMT constituted as stated above, a part of the electric flux line heading from the gate electrode 14g to the drain electrode 14d is collected by the electric flux line collecting part 27. Accordingly, it is possible to reduce the parasitic capacitance $C_{gd}$ between the gate electrode 14g and the drain electrode 14d compared to a structure in which the electric flux line collecting part 27 is not provided.

An electric potential of the electric flux line collecting part 27 is not particularly limited, but the electric flux line collecting part 27 is preferably connected to the source electrode 14s. When the electric flux line collecting part 27 is connected to the source electrode 14s, the part of electric flux line collected by the electric flux line collecting part 27 act similarly to the electric flux line heading from the gate electrode 14g to the source electrode 14s, and the parasitic capacitance $C_{gs}$ between the gate electrode 14g and the source electrode 14s increases. On the other hand, the parasitic capacitance $C_{gd}$ between the gate electrode 14g and the drain electrode 14d decreases. Accordingly, it is possible to more certainly improve the maximum oscillation frequency $f_{max}$, which is important to improve the gain of the HEMT. The electric flux line collecting part 27 and the source electrode 14s may be connected via a wiring routed not right above but at a side of the gate electrode 14g, for example, or the like. It is possible to obtain a similar effect even when the electric flux line collecting part 27 is not connected to the source electrode 14s, if it is grounded, for example.

As stated above, according to the second embodiment also, it is possible to adjust the parasitic capacitance $C_{gs}$ and the parasitic capacitance $C_{gd}$ properly, and to improve the output characteristics. In particular, it is extremely suitable for a super-high frequency device whose drain conductance is high and drain voltage (operation voltage) is small such as approximately 1 V.

Next, a method of manufacturing the compound semiconductor device (HEMT) according to the second embodiment is described. FIG. 4A to FIG. 4J are sectional views illustrating the method of manufacturing the compound semiconductor device according to the second embodiment in process sequence.

Figure 4A:
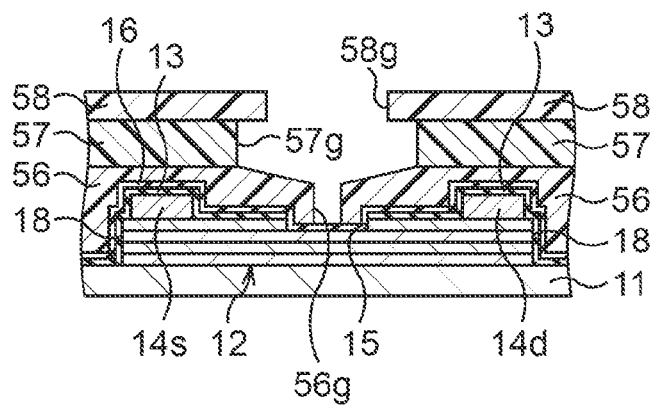
FIG. 4A to FIG. 4J are sectional views illustrating a method of manufacturing the compound semiconductor device according to the second embodiment in process sequence.

First, as illustrated in FIG. 4A, the processes up to the formation of the insulating film 16 are performed as same as the first embodiment. Then, the resist pattern 56, the resist pattern 57 and the resist pattern 58 are formed on the insulating film 16 without forming the electric flux line collecting part 17.

Figure 4B:
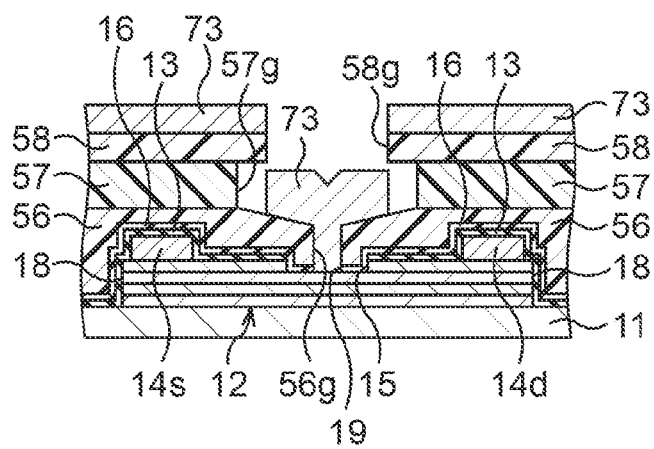

Thereafter, as illustrated in FIG. 4B, dry-etching using the resist pattern 58, the resist pattern 57 and the resist pattern 56 as a mask is performed to thereby form the recess 19 in the insulting film 16. Subsequently, the metal film 73 is formed by a vacuum deposition method.

Figure 4C:
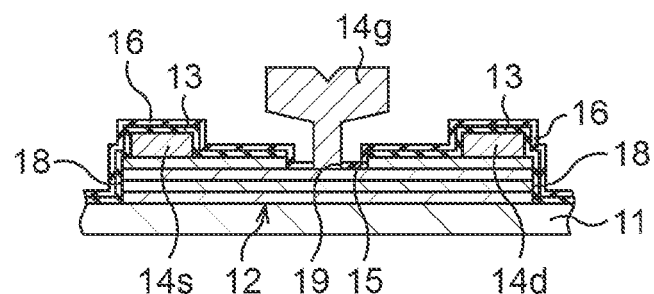

Then, as illustrated in FIG. 4C, the resist pattern 58, the resist pattern 57 and the resist pattern 56 are removed together with the metal film 73 thereon with a heated organic solvent, for example. Namely, a part of the metal film 73 is remained on the electron supply layer 12c by a lift-off method. As a result, the gate electrode 14g is obtained.

Figure 4D:
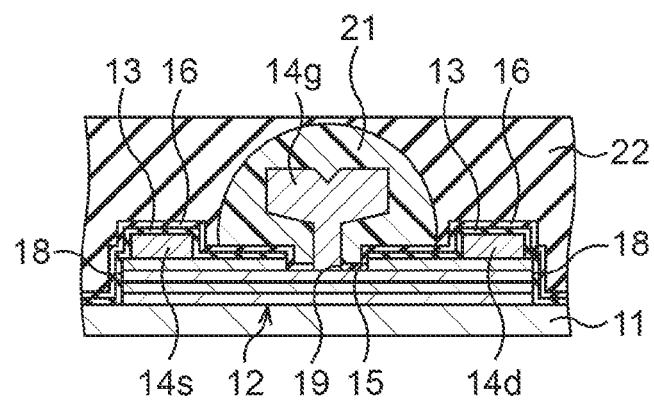

Thereafter, as illustrated in FIG. 4D, a filler 21 is provided so as to be in contact with the gate electrode 14g at a region where the cavity part 23 is to be formed, and the interlayer insulating film 22 is formed on the filler 21 and the insulating film 16. A material of the filler 21 is PMGI, for example.

Figure 4E:
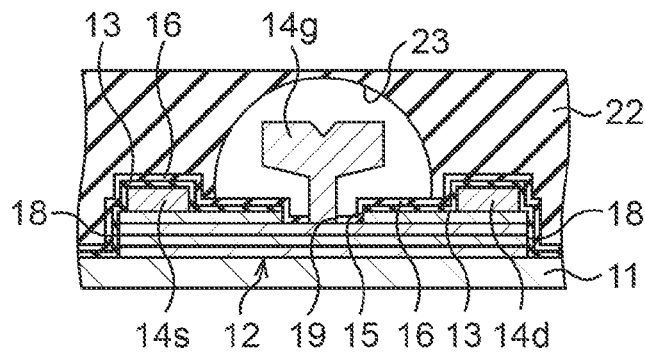

Subsequently, as illustrated in FIG. 4E, the filler 21 is removed while remaining the interlayer insulating film 22 to thereby form the cavity part 23.

Figure 4F:
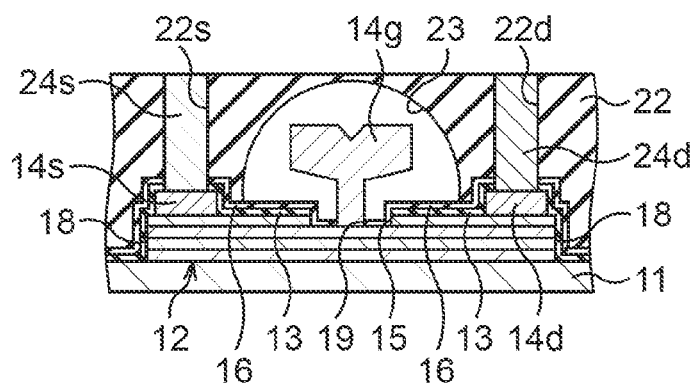

Then, as illustrated in FIG. 4F, the opening 22s reaching the source electrode 14s and the opening 22d reaching the drain electrode 14d are formed in the interlayer insulating film 22, the insulating film 16 and the insulating film 13. Thereafter, the conductive film 24s is formed in the opening 22s, and the conductive film 24d is formed in the opening 22d. The conductive film 24s and the conductive film 24d may be formed by a plating method, for example.

Figure 4G:
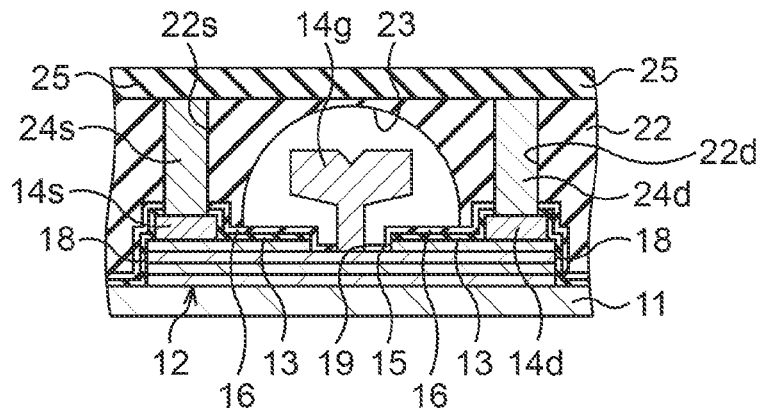

Subsequently, as illustrated in FIG. 4G, the insulating film 25 is formed on the interlayer insulating film 22, the conductive film 24s and the conductive film 24d. A silicon nitride film is formed as the insulating film 25 by a plasma CVD method, for example.

Figure 4H:
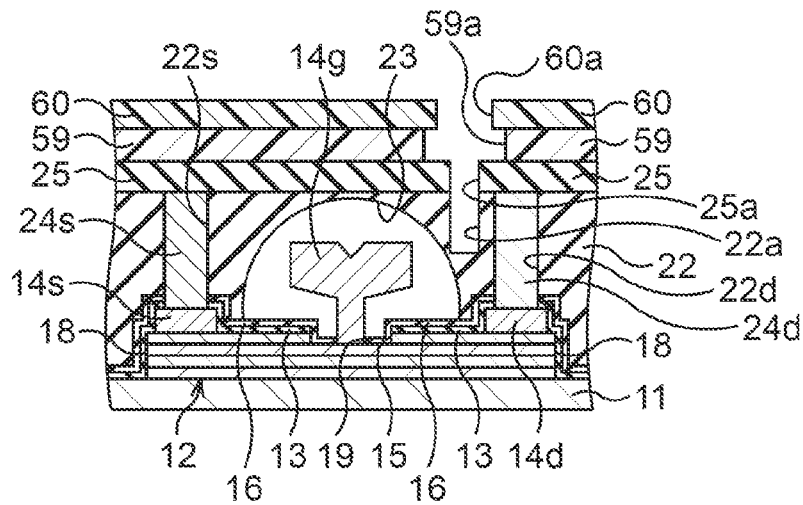

Then, as illustrated in FIG. 4H, a resist pattern 59 and a resist pattern 60 are formed on the insulating film 25. The resist pattern 59 has an opening 59a at a region where the electric flux line collecting part 27 is to be formed. The resist pattern 60 has an opening 60a at a region where the electric flux line collecting part 27 is to be formed. In the formation of the resist pattern 59 and the resist pattern 60, two resist layers are formed, and the opening 60a is formed in the upper resist layer to form the resist pattern 60. Then, the opening 59a is formed in the lower resist layer with using the resist pattern 60 as a mask to thereby form the resist pattern 59 having a set-back structure. PMGI (for example, manufactured by MicroChem Corp., USA) is used as a material of the resist pattern 59, for example, and ZEP520 manufactured by ZEON Corporation, Japan is used as a material of the resist pattern 60, for example. For example, a thickness of the resist pattern 59 is approximately 500 nm, and a thickness of the resist pattern 60 is approximately 300 nm. The resist materials may be coated by a spin coating method, and pre-baked at 180° C. for five minutes in an $N_2$ gas atmosphere. Electron beam lithography is performed in exposure, and a mixed developing solution of MEK and MIBK is used as a developing solution, for example, when the opening 60a is formed. A size of the opening 60a along the direction from the source electrode 14s to the drain electrode 14d is approximately 0.7 μm, for example. In the formation of the opening 59a, NMD-W manufactured by TOKYO OHKA KOGYO Co., Ltd. is used as a developing solution, for example. A size of the opening 59a along the direction from the source electrode 14s to the drain electrode 14d is approximately 1.7 μm, for example. A stacked resist pattern in an eaves structure is thereby obtained.

Thereafter, similarly as illustrated in FIG. 4H, dry-etching using the resist pattern 60 and the resist pattern 59 as a mask is performed, and thereby, the opening 25a is formed in the insulating film 25, and the opening 22a is formed in the interlayer insulating film 22. When the opening 25a is formed, $SF_6$ gas is used, for example, and when the opening 22a is formed $O_2$ gas is used, for example.

Figure 4I:
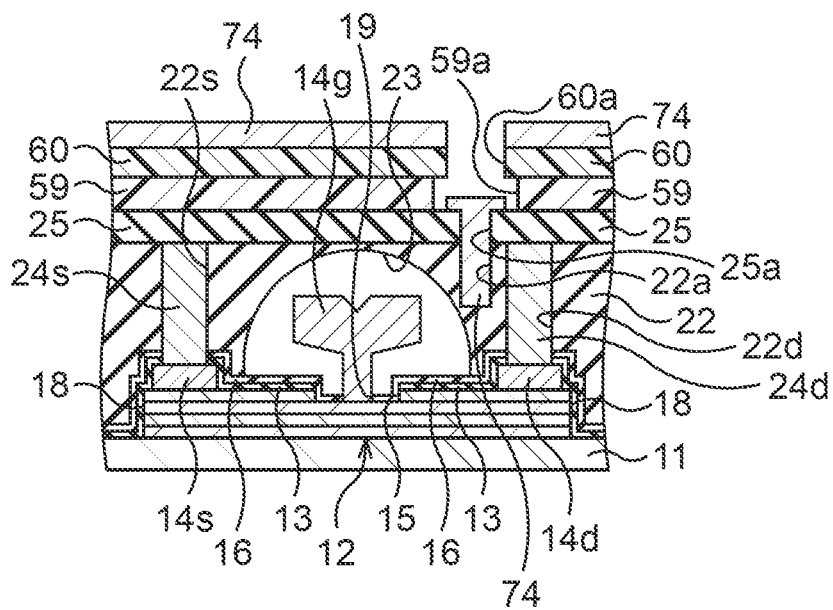

Subsequently, as illustrated in FIG. 4I, a metal film 74 is formed by a vacuum deposition method. A Au layer is formed as the metal film 74, for example. A thickness of the Au layer is approximately 200 nm.

Figure 4J:
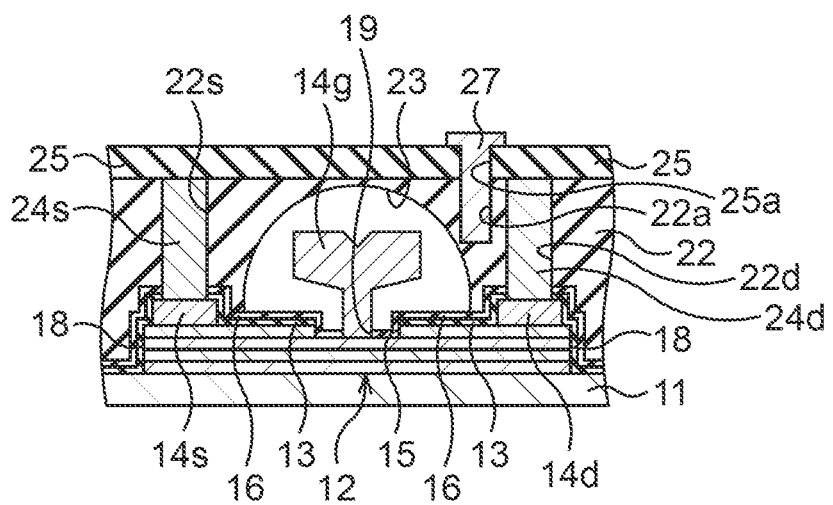

Then, as illustrated in FIG. 4J, the resist pattern 59 and the resist pattern 60 are removed together with the metal film 74 thereon with a heated organic solvent, for example. As a result, the electric flux line collecting part 27 is obtained.

A protective film, a wiring and so on are formed according to need, to complete the compound semiconductor device (HEMT).

Small signal parameters of a compound semiconductor device manufactured by the present inventor following the second embodiment are listed in Table 2. In Table 2, small signal parameters of a reference example in which the electric flux line collecting part 27 is not provided are also listed. As it is obvious from Table 2, the superior maximum oscillation frequency $f_{max}$ is obtained by the second embodiment to the reference example.

TABLE 2

|  | Second embodiment | Reference example |
|---|---|---|
| $C_{gs}$ (fF/mm) | 380 | 350 |
| $C_{gd}$ (fF/mm) | 70 | 100 |
| $C_{ds}$ (fF/mm) | 240 | 150 |
| $f_T$ (GHz) | 380 | 390 |
| $f_{max}$ (GHz) | 650 | 540 |

A resist pattern other than the resist pattern (film-forming mask) used for the formation of the electric flux line collecting part 27 may be used as a resist pattern (etching mask) used for the formation of the opening 25a and the opening 22a. In this case, PMMA (for example, manufactured by MicroChem Corp., USA) may be used as a material of the resist pattern used for the formation of the opening 25a and the opening 22a, for example. The resist material may be coated by a spin coating method. Electron beam lithography is performed in exposure, and a mixed developing solution of MIBK and IPA is used as a developing solution, for example, when the openings are formed in the resist pattern. The size of the opening 25a and the opening 22a along the direction from the source electrode 14s to the drain electrode 14d is approximately 500 nm, for example.

Third Embodiment

Figure 5:
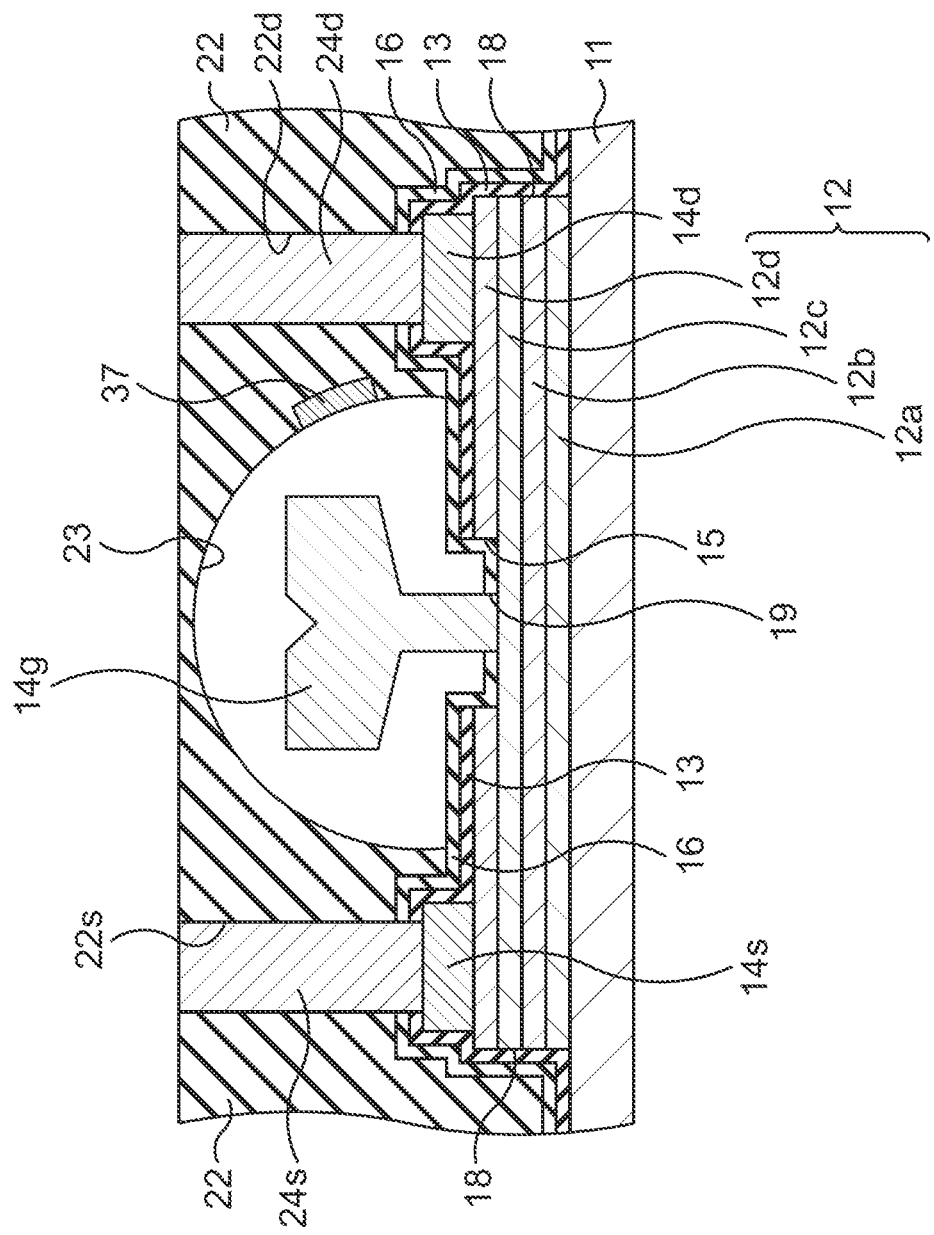
FIG. 5 is a sectional view illustrating a structure of a compound semiconductor device according to a third embodiment.

Next, a third embodiment is described. FIG. 5 is a sectional view illustrating a structure of a compound semiconductor device (HEMT) according to the third embodiment.

In the third embodiment, as illustrated in FIG. 5, an electric flux line collecting part 37 is provided instead of the electric flux line collecting part 27 in the interlayer insulating film 22. The electric flux line collecting part 37 faces the cavity part 23, and is at a level below the vertex part of the gate electrode 14g between the gate electrode 14g and the drain electrode 14d. The electric flux line collecting part 37 includes a metal film, for example. Besides, the insulating film 25 is not provided. The other structures are as same as the second embodiment.

In the HEMT constituted as stated above, a part of the electric flux line heading from the gate electrode 14g to the drain electrode 14d is collected by the electric flux line collecting part 37. Accordingly, it is possible to reduce the parasitic capacitance $C_{gd}$ between the gate electrode 14g and the drain electrode 14d compared to a structure in which the electric flux line collecting part 37 is not provided.

An electric potential of the electric flux line collecting part 37 is not particularly limited, but the electric flux line collecting part 37 is preferably connected to the source electrode 14s. When the electric flux line collecting part 37 is connected to the source electrode 14s, the part of electric flux line collected by the electric flux line collecting part 37 act similarly to the electric flux line heading from the gate electrode 14g to the source electrode 14s, and the parasitic capacitance $C_{gs}$ between the gate electrode 14g and the source electrode 14s increases. On the other hand, the parasitic capacitance $C_{gd}$ between the gate electrode 14g and the drain electrode 14d decreases. Accordingly, it is possible to more certainly improve the maximum oscillation frequency $f_{max}$, which is important to improve the gain of the HEMT. The electric flux line collecting part 37 and the source electrode 14s may be connected via a wiring routed not right above but at a side of the gate electrode 14g, for example, or the like. It is possible to obtain a similar effect even when the electric flux line collecting part 37 is not connected to the source electrode 14s, if it is grounded, for example.

As stated above, according to the third embodiment also, it is possible to adjust the parasitic capacitance $C_{gs}$ and the parasitic capacitance $C_{gd}$ properly, and to improve the output characteristics. In particular, it is extremely suitable for a super-high frequency device whose drain conductance is high and drain voltage (operation voltage) is small such as approximately 1 V.

Figure 6A:
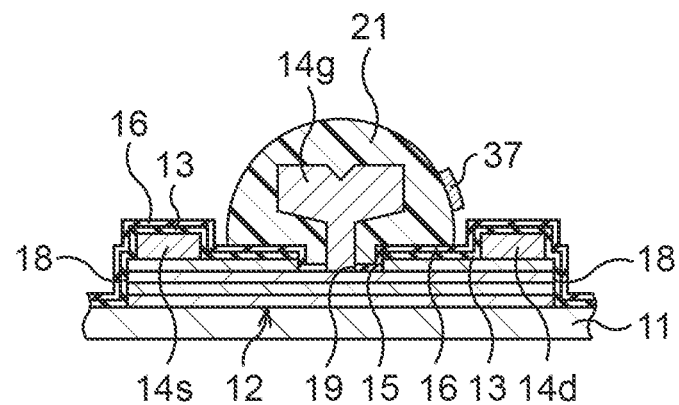
FIG. 6A to FIG. 6C are sectional views illustrating a method of manufacturing the compound semiconductor device according to the third embodiment in process sequence.
Figure 6B:
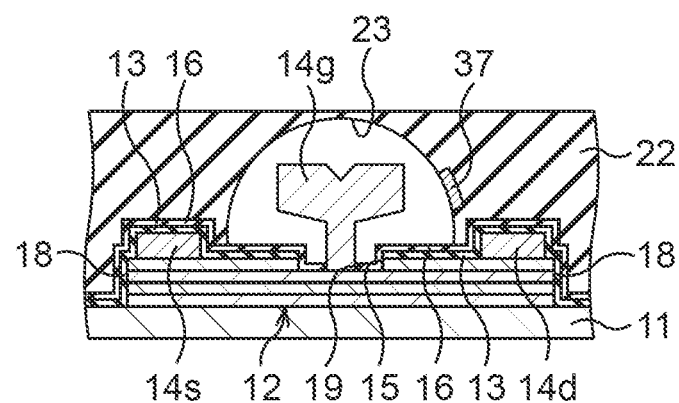
Figure 6C:
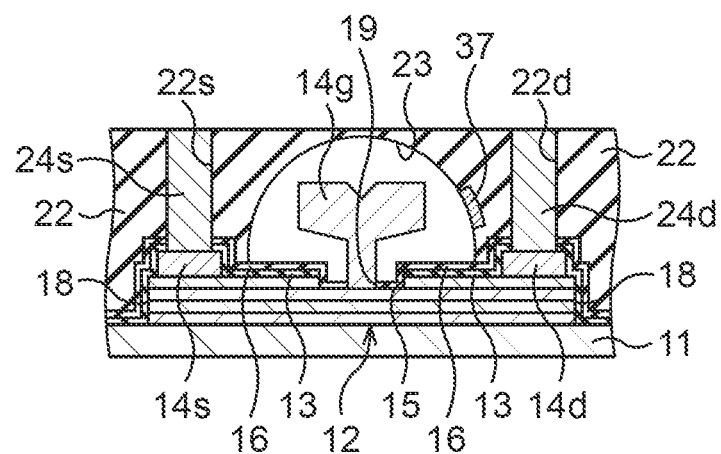

Next, a method of manufacturing the compound semiconductor device (HEMT) according to the third embodiment is described. FIG. 6A to FIG. 6C are sectional views illustrating the method of manufacturing the compound semiconductor device according to the third embodiment in process sequence.

First, as illustrated in FIG. 6A, the processes up to the formation of the filler 21 are performed as same as the second embodiment. Then, the electric flux line collecting part 37 is formed on a part of the filler 21 by a lift-off method or the like.

Thereafter, as illustrated in FIG. 6B, the interlayer insulating film 22 is formed on the filler 21, the electric flux line collecting part 37, and the insulating film 16. Subsequently, the filler 21 is removed while remaining the interlayer insulating film 22 to thereby form the cavity part 23.

Then, as illustrated in FIG. 6C, the opening 22s and the opening 22d are formed, and the conductive film 24s and the conductive film 24d are formed as same as the second embodiment.

A protective film, a wiring and so on are formed according to need, to complete the compound semiconductor device (HEMT).

Fourth to Sixth Embodiments

Figure 7A:
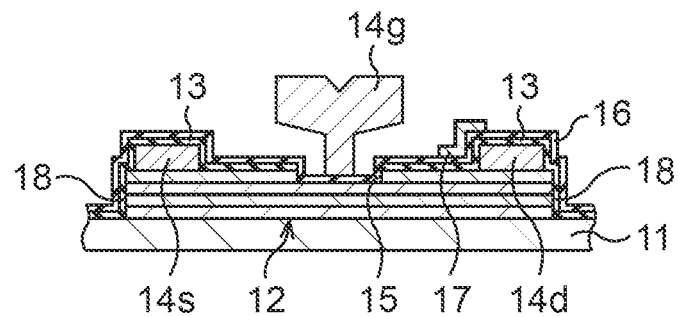
FIG. 7A is a sectional view illustrating a structure of a compound semiconductor device according to a fourth embodiment.
Figure 7B:
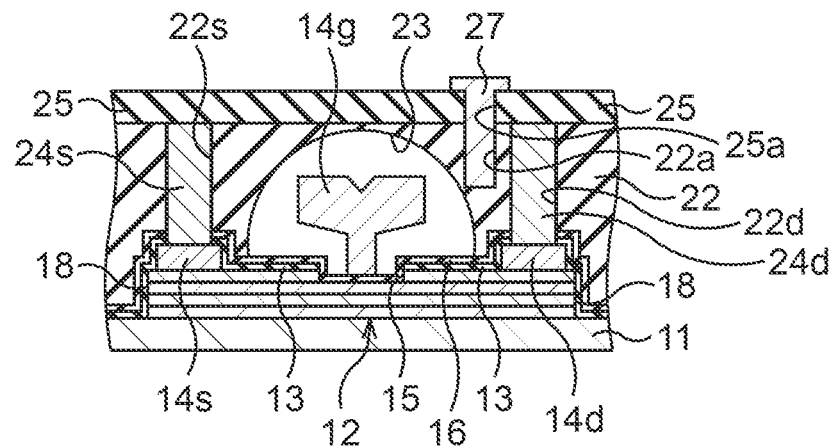
FIG. 7B is a sectional view illustrating a structure of a compound semiconductor device according to a fifth embodiment.
Figure 7C:
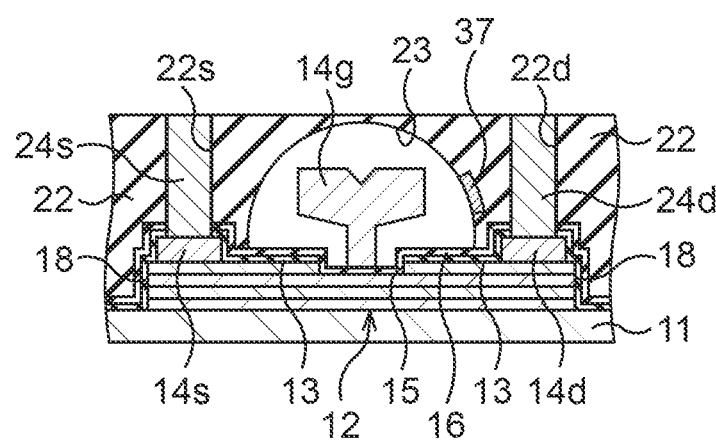
FIG. 7C is a sectional view illustrating a structure of a compound semiconductor device according to a sixth embodiment.

Next, a fourth embodiment to a sixth embodiment are described. FIG. 7A, FIG. 7B, and FIG. 7C are sectional views respectively illustrating structures of compound semiconductor devices (HEMT) according to the fourth embodiment, the fifth embodiment, and the sixth embodiment.

In the fourth embodiment, a part of the insulating film 16 exists between the gate electrode 14g and the compound semiconductor stacked structure 12, and the insulating film 16 functions as a gate insulating film, though the gate electrode 14g is in Schottky junction with the compound semiconductor stacked structure 12 via the recess 19 In the first embodiment. Namely, the recess 19 is not formed, and an MIS type structure is employed.

It is also possible to improve the output characteristics by the fourth embodiment similarly to the first embodiment.

A material of the insulating film 16 is not particularly limited, but an oxide, a nitride or an oxynitride of Si, Al, Hf, Zr, Ti, Ta or W is preferable, for example, and the Al oxide is particularly preferable. Specifically, SiN, $SiO_2$, HfO, $Al_2O_3$, AlN, and so on are used.

The fifth and sixth embodiments are ones in which an MIS type structure as stated above is each employed to the second and third embodiments. To obtain the insulating film 16 included in the MIS type structure, the formation of the recess 19 is omitted, for example.

Seventh Embodiment

Figure 8:
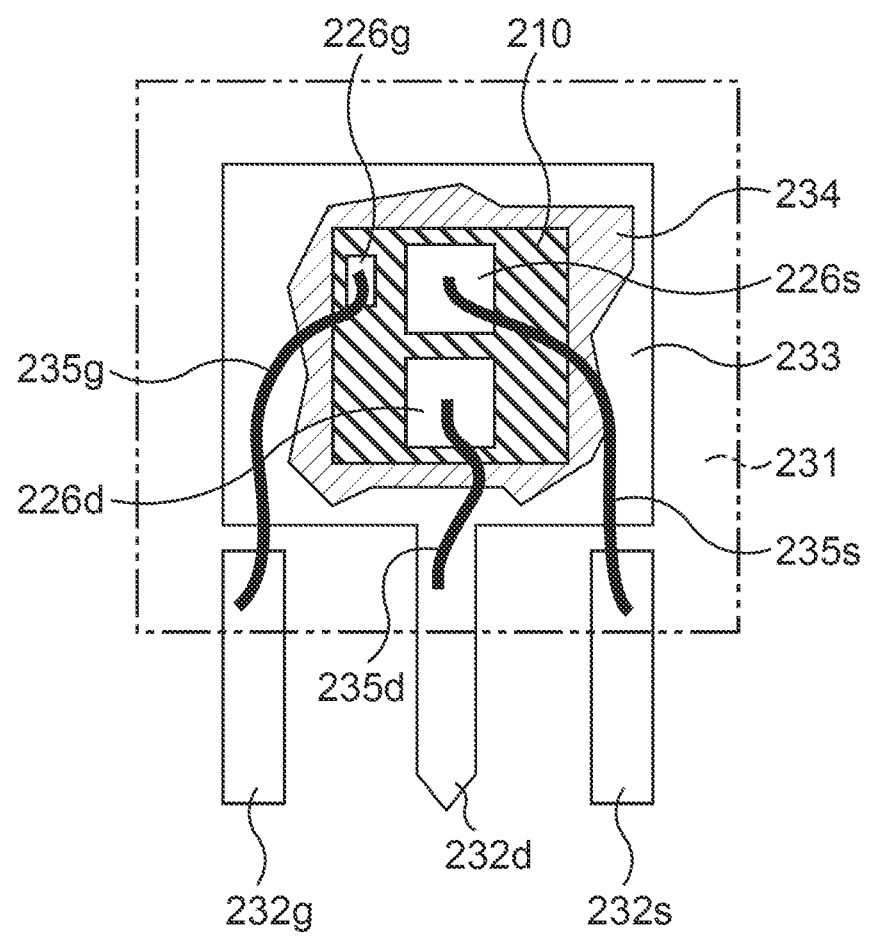
FIG. 8 is a view illustrating a discrete package according to a seventh embodiment.

A seventh embodiment relates to a discrete package of a HEMT. FIG. 8 is a view illustrating the discrete package according to the seventh embodiment.

In the seventh embodiment, as illustrated in FIG. 8, a back surface of a HEMT chip 210 of the compound semiconductor device according to any one of the first to sixth embodiments is fixed on a land (die pad) 233, using a die attaching agent 234 such as solder. One end of a wire 235d such as an Al wire is bonded to a drain pad 226d, to which the drain electrode 14d is connected, and the other end of the wire 235d is bonded to a drain lead 232d integral with the land 233. One end of a wire 235s such as an Al wire is bonded to a source pad 226s, to which the source electrode 14s is connected, and the other end of the wire 235s is bonded to a source lead 232s separated from the land 233. One end of a wire 235g such as an Al wire is bonded to a gate pad 226g, to which the gate electrode 14g is connected, and the other end of the wire 235g is bonded to a gate lead 232g separated from the land 233. The land 233, the HEMT chip 210 and so on are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Then, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. The molding with the molding resin 231 is conducted by a transfer molding process. The lead frame is then cut away.

A composition of compound semiconductor layers used for a compound semiconductor stacked structure is not particularly limited, and a nitride semiconductor layer may be used. For example, a GaN channel layer 12b, an AlGaN electron supply layer 12c, and a GaN surface layer 12d may be used together. A GaN channel layer 12b, an InAlN electron supply layer 12c and a GaN surface layer 12d may be used together. A GaN channel layer 12b, an InAlN electron supply layer 12c and an InGaN surface layer 12d may be used together. Various low dielectric constant films may be used for the interlayer insulating film 22.

A structure of a gate electrode, a source electrode, and a drain electrode is not limited to the above-stated embodiments. For example, these may each be composed of a single layer. A structure of the gate electrode may be an overhang type, and a rectangular gate electrode may be used. A formation method of the gate electrode, the source electrode and the drain electrode is not limited to a lift-off method.

As a substrate, an SiC substrate, a sapphire substrate, a silicon substrate, a GaN substrate, a GaAs substrate, or the like may be used. The substrate may be any one of a conductive, a semi-insulating, or an insulating substrate. The thickness, material, and so on of each layer are not limited to ones in the above-stated embodiments.

According to the compound semiconductor device and so on, a proper metal film is formed, and thereby, it is possible to improve output characteristics by reducing a parasitic capacitance between a gate and a drain.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a channel layer of arsenide semiconductor;
   an electron supply layer of InAlAs over the channel layer;
   a gate electrode, a source electrode and a drain electrode over the channel layer;
   an insulating film covering the gate electrode with a space, the space being empty between the insulating film and the gate electrode and the gate electrode being inside the space; and
   a metal film between the gate electrode and the drain electrode, the metal film being insulated from the gate electrode and the drain electrode and at least a part of the metal film being at a level below a vertex part of the gate electrode, wherein
   the source electrode and the metal film are connected to each other via a wiring routed at a side of the gate electrode.

2. A compound semiconductor device, comprising:
   a channel layer of compound semiconductor;
   an electron supply layer of InAlAs over the channel layer;
   a gate electrode, a source electrode and a drain electrode over the channel layer;
   an insulating film covering the gate electrode with a space, the space being empty between the insulating film and the gate electrode and the gate electrode being inside the space; and
   a metal film between the gate electrode and the drain electrode, the metal film being insulated from the gate electrode and the drain electrode and at least a part of the metal film being at a level below a vertex part of the gate electrode, wherein
   the source electrode and the metal film are connected to each other via a wiring routed at a side of the gate electrode.

3. The compound semiconductor device according to claim 1, wherein the metal film is connected to the source electrode.

4. The compound semiconductor device according to claim 1, wherein
   the drain electrode is formed on the electron supply layer so as to be in direct contact with the electron supply layer.

5. The compound semiconductor device according to claim 1, wherein a space exists between the gate electrode and the drain electrode.

6. A method of manufacturing a compound semiconductor device, comprising:
   forming a channel layer of arsenide semiconductor;
   forming an electron supply layer of InAlAs over the channel layer;
   forming a gate electrode, a source electrode and a drain electrode over the channel layer;
   forming an insulating film covering the gate electrode with a space, the space being empty between the insulating film and the gate electrode and the gate electrode being inside the space; and
   forming a metal film between the gate electrode and the drain electrode, the metal film being insulated from the gate electrode and the drain electrode and at least a part of the metal film being at a level below a vertex part of the gate electrode, wherein the source electrode and the metal film are connected to each other via a wiring routed at a side of the gate electrode.

7. A method of manufacturing a compound semiconductor device, comprising:
forming a channel layer of compound semiconductor;
forming an electron supply layer of InAlAs over the channel layer;
forming a gate electrode, a source electrode and a drain electrode over the channel layer;
forming an insulating film covering the gate electrode with a space, the space being empty between the insulating film and the gate electrode and the gate electrode being inside the space; and
forming a metal film between the gate electrode and the drain electrode, the metal film being insulated from the gate electrode and the drain electrode and at least a part of the metal film being at a level below a vertex part of the gate electrode, wherein
the source electrode and the metal film are connected to each other via a wiring routed at a side of the gate electrode.

8. The method according to claim 6, wherein the metal film is connected to the source electrode.

9. The method according to claim 6, wherein
the drain electrode is formed on the electron supply layer so as to be in direct contact with the electron supply layer.

10. The method according to claim 6, wherein a space exists between the gate electrode and the drain electrode.

* * * * *